United States Patent
Senzaki

(10) Patent No.: US 6,933,011 B2
(45) Date of Patent: Aug. 23, 2005

(54) TWO-STEP ATOMIC LAYER DEPOSITION OF COPPER LAYERS

(75) Inventor: Yoshihide Senzaki, Aptos, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 0 days.

(21) Appl. No.: 10/686,898

(22) Filed: Oct. 15, 2003

(65) Prior Publication Data

US 2004/0175502 A1 Sep. 9, 2004

Related U.S. Application Data

(60) Provisional application No. 60/419,633, filed on Oct. 17, 2002.

(51) Int. Cl.[7] ............................................. C23C 16/06
(52) U.S. Cl. ................................. 427/250; 427/255.31
(58) Field of Search .............................. 427/250, 255.31

(56) References Cited

U.S. PATENT DOCUMENTS

| | | | | |
|---|---|---|---|---|
| 4,997,516 A | * | 3/1991 | Adler | .......................... 216/101 |
| 4,997,722 A | * | 3/1991 | Adler | .......................... 428/596 |
| 5,753,309 A | * | 5/1998 | Fakler et al. | ................ 427/399 |
| 5,925,403 A | * | 7/1999 | Yoshizawa et al. | ....... 427/126.3 |
| 6,482,740 B2 | * | 11/2002 | Soininen et al. | ............ 438/686 |

* cited by examiner

*Primary Examiner*—Bret Chen
(74) *Attorney, Agent, or Firm*—Dorsey & Whitney LLP

(57) ABSTRACT

A method of forming copper films at low temperatures is provided. The method comprises two steps of forming a copper oxide layer from a non-fluorine containing copper precursor on a substrate and reducing the copper oxide layer to form a copper layer on the substrate. The formation of copper oxide is carried out by atomic layer deposition using a non-fluorine containing copper precursor and an oxygen containing gas at a low temperature. Copper alkoxides, copper β-diketonates and copper dialkylamides are preferred copper precursors. The reduction of copper oxide layer formed is carried out using a hydrogen containing gas at a low temperature.

17 Claims, 1 Drawing Sheet

TWO-STEP ATOMIC LAYER DEPOSITION OF COPPER LAYERS

CROSS REFERENCE TO RELATED APPLICATIONS

This application claims the benefit of and priority to U.S. Provisional Patent Application No. 60/419,633 filed Oct. 17, 2002, the disclosure of which is hereby incorporated by reference in its entirety.

FIELD OF THE INVENTION

The present invention relates generally to the field of semiconductors. More specifically, the present invention relates to deposition of copper films for manufacturing semiconductor devices.

BACKGROUND OF THE INVENTION

Copper (Cu) has emerged as an alternative interconnect metal to conventional aluminum in integrated circuitry (IC) device fabrication due to its low resistivity and good electromigration properties. Several deposition techniques, such as physical vapor deposition (PVD), chemical vapor deposition (CVD), and electrochemical plating have been used for copper "damascene" interconnect fabrication. Both PVD and plating methods suffer from difficulty in filling copper in narrow and deeply trenched structures and such methods form voids that lead to defect formation. CVD techniques, which offer good conformal coverage, are used to provide copper seed layers in order to enhance nucleation of copper growth and suppress void formation for sub-0.18 micron scale IC device fabrication.

In prior art CVD methods, copper precursors of the type: (hfac)CuL, where hfac represents hexafluoroacetylacetonate and L represents a neutral ligand, have been typically used. Copper precursors of the type of (hfac)CuL undergo "disproportionation reaction" at temperatures below 200° C. to provide copper thin films, as shown in the following equation:

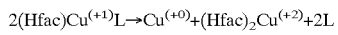

$$2(Hfac)Cu^{(+1)}L \rightarrow Cu^{(+0)} + (Hfac)_2Cu^{(+2)} + 2L$$

Alternatively, $(Hfac)_2Cu$ is used as a copper precursor in metal-organic chemical vapor deposition (MOCVD) for copper films. However, MOCVD using $(Hfac)_2Cu$ precursor requires relatively high deposition temperatures (such as above 400° C.) and hydrogen ($H_2$) gas as a reducing agent.

Another problem of prior art techniques for CVD of copper films using hfac-based copper precursors is the incorporation of trace amount of fluorine atoms at the interface between the substrate and copper layer, which degrades adhesion of the copper layer to the substrate. This causes problems when the deposited copper films undergo a chemical mechanical polishing (CMP) step to fabricate the copper interconnect structure in the back-end-of-line IC processing. Accordingly, further development of deposition techniques and processes of copper films is needed.

SUMMARY OF THE INVENTION

In general, the present invention provides a method of forming copper films on a substrate. In one embodiment, the method comprises the steps of forming a copper oxide layer from a non-fluorine containing copper precursor on a substrate and reducing the copper oxide layer to form a copper layer on the substrate. The formation of copper oxide is carried out by atomic layer deposition using a non-fluorine containing copper precursor and an oxygen containing gas at a low temperature below 200° C. Copper alkoxides, copper β-diketonates and copper dialkylamides are preferred copper precursors. The reduction of the copper oxide layer formed is carried out using a hydrogen containing gas at a low temperature below about 200° C. In one embodiment, the temperatures for formation of the copper oxide and reduction of the formed copper oxide to copper are substantially same.

In another aspect of the present invention, a method of forming a copper film or layer on a substrate is provided, comprising introducing a non-fluorine containing copper precursor gas about a substrate provided in a chamber, removing excess copper precursor gas from the chamber, introducing an oxygen containing gas into the chamber to form a layer of copper oxide on the substrate, removing excess ozone from the chamber, and introducing a hydrogen containing gas into the chamber to reduce the copper oxide layer to form a copper layer.

BRIEF DESCRIPTION OF THE DRAWINGS

The present invention will be better understood upon reading the following detailed description of the invention and claims, accompanied by the following drawing, in which:

DETAILED DESCRIPTION OF THE INVENTION

Figure 1:
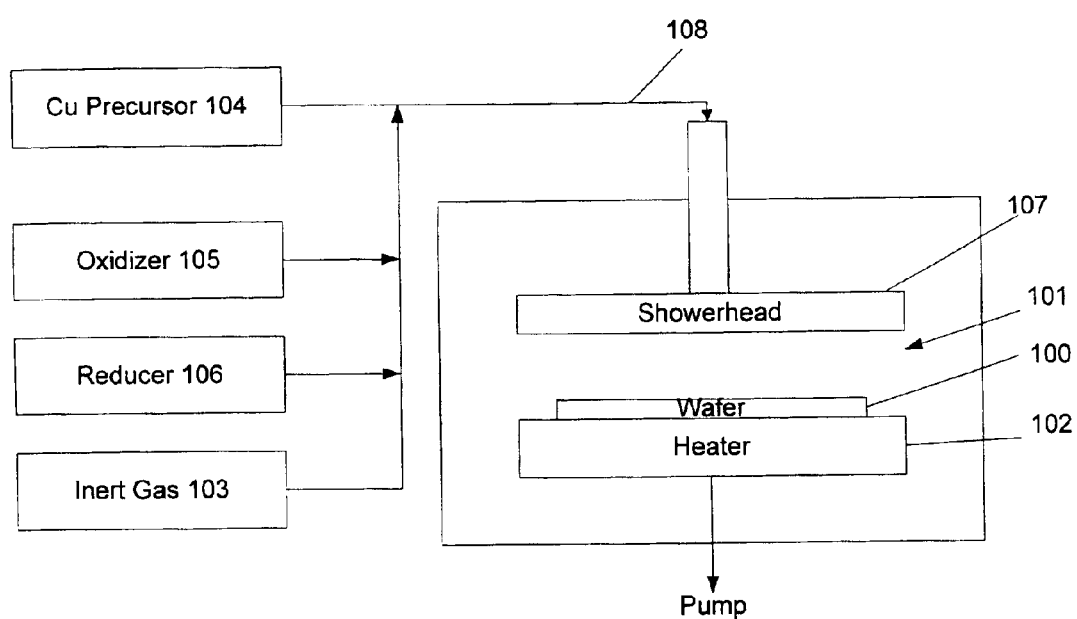
FIG. 1 is a schematic view of a reactor system that can be used to perform the method according to one embodiment of the present invention.

The present invention provides a method of forming copper layers or films on a substrate. More specifically, in one embodiment, a method of forming copper layers by atomic layer deposition of copper to form non-fluorine containing copper films at low temperatures is provided. In general, the present method of forming copper films in one embodiment comprises steps of forming a copper oxide layer from a non-fluorine containing copper precursor on a substrate and reducing the copper oxide layer to form a copper layer on the substrate. The temperatures of forming a copper oxide layer from a non-fluorine containing copper precursor and reducing the copper oxide to a copper layer can be the same so that there is no need to change the process temperatures during the two steps. Alternatively, if desired the forming and reducing steps may be carried out at different temperatures.

The formation of copper oxide is carried out by atomic layer deposition using non-fluorine containing copper precursors and an oxygen containing gas at a low temperature, preferably below about 200° C. Of advantage, the atomic layer deposition can be performed at comparatively lower temperatures, which is compatible with the industry's trend toward lower temperatures. Atomic layer deposition has high precursor utilization efficiency, can produce conformal thin film layers, can control film thickness on an atomic scale, and can be used to "nano-engineer" complex thin films. In an ALD process deposition cycle, each reactant gas is introduced independently into a reaction chamber, so that no gas phase intermixing occurs. A monolayer of a first reactant is physi- or chemisorbed onto the substrate surface. Excess first reactant is evacuated from the reaction chamber preferably with the aid of an inert purge gas. A second reactant is then introduced to the reaction chamber and reacted with the first reactant to form a monolayer of the desired thin film via a self-limiting surface reaction. The self-limiting reaction stops once the initially adsorbed first reactant fully reacts with the second reactant. Excess second reactant is evacuated, preferably with the aid of an inert purge gas. A desired film thickness is obtained by repeating the deposition cycle as necessary. The film thickness can be controlled to atomic layer accuracy by simply counting the number of deposition cycles.

The copper precursors used in the present invention are non-fluorine containing copper precursors. One advantage of non-fluorine containing copper precursors is the prevention of formation of trace amount of fluorine atoms at the interface between the substrate and the copper layer, which degrades adhesion of the copper layer to the substrate. Suitable non-fluorine containing copper precursors include but are not limited to copper alkoxide, copper β-diketonate and copper dialkylamide. An example of copper alkoxide includes copper (I) tert-butoxide [Cu(t-BuO)]$_4$. An example of copper β-diketonate includes Cu(tetramethylheptadionate)$_2$. Copper dialkylamide preferably has the formula of [Cu(NR$_2$)]$_4$ where R represents alkyl. The copper oxides formed in the atomic layer deposition step include cupric oxide (CuO) and cuprous oxide (Cu$_2$O).

Suitable oxygen containing gases used in the atomic layer deposition step include but are not limited to ozone, oxygen, water, or mixtures thereof. The oxygen containing gas reacts with the copper precursor monolayer absorbed on the substrate to form copper oxide on the surface of the substrate. Of particular advantage, this deposition or forming step is carried out at low temperatures. In one embodiment the temperature is in the range of 100 to 300° C. Preferably the temperature is below 200° C.

The subsequent reduction of copper oxide is performed by using a hydrogen containing gas at a low temperature, preferably below about 200° C. The hydrogen containing gas can optionally contain an inert gas, such as, but not limited to: nitrogen, argon, and helium. The reduction of copper oxide can be illustrated by the following equations:

$$CuO(s)+H_2(g) \rightarrow Cu(s)+H_2O(g) \quad (1)$$

$$Cu_2O(s)+H_2(g) \rightarrow Cu(s)+H_2O(g) \quad (2)$$

In one embodiment, the temperature for reduction of the formed copper oxide to copper layer and for formation of copper oxide by atomic layer deposition is substantially the same, in the range of 100 to 300° C. and preferably below 200° C. Accordingly, there is no need for changing process temperatures for the two sequential chemical reactions. Alternatively, different temperatures may be employed in forming and reducing steps.

The repetition of the cycle of forming of copper oxide and reducing of the formed copper oxide provides a copper film with a desired thickness.

In one embodiment, the present method of forming copper thin film comprises the following steps. A non-fluorine containing copper precursor gas is introduced into an atomic layer deposition chamber where a substrate is provided. Then a purge gas is introduced into the chamber to remove excess copper precursor. Ozone is introduced into the chamber to form a layer of copper oxide on the substrate at a low temperature. A purge gas is again introduced to remove excess ozone. A hydrogen containing gas is introduced into the chamber to reduce the formed copper oxide layer to a copper layer at a low temperature.

FIG. 1 is a simplified schematic view showing a reactor system that can be used to perform the formation of a copper layer according to one embodiment of the present invention. The reactor system shown in FIG. 1 is provided for illustrative purpose only and is not intended to limit the scope of the invention in any way. The method of the present invention can be performed in any suitable reactor system and is not limited to the specific reactor system as shown in FIG. 1. In another embodiment, a reactor system as described in U.S. Pat. Nos. 6,183,563 and 6,573,184, the disclosures of which are hereby incorporated by reference, may be used.

With reference to FIG. 1, a wafer 100 is transferred into a deposition zone 101 which is previously evacuated. The wafer 100 is placed on a wafer heater 102 where the wafer is heated to a deposition temperature. In one embodiment, the deposition temperature in the range of about 100 to 300° C. and is preferably below 200° C. A steady flow of an inert gas is introduced from an inert gas source 103 into the deposition zone 101. As shown in FIG. 1, all of the various gases are conveyed to the reactor via delivering line 108 through appropriate valves (not shown). Alternatively, one or more of the gases may be conveyed by separate delivery lines. The inert gas can be Ar, He, Ne, Xe, N$_2$, mixtures thereof, or other non-reactive gas. A pressure within the deposition zone is established to a process pressure in the range of about 100 mTorr to 10 Torr, and preferably in the range of about 200 mTorr to 1.5 Torr.

After an appropriate time to remove any residual gases from the surface of the wafer 100 and after a steady state pressure is achieved, atomic layer deposition is initiated. The non-fluorine containing copper precursor is provided by source 104. A pulse of the non-fluorine containing copper precursor vapor flow is introduced into the deposition zone 101 through a showerhead 107 by opening appropriate valves (not shown). The copper precursor vapor flow rate is in the range of about 1 to 1000 sccm, and is preferably in the range of about 5 to 100 sccm. The precursor vapor may be diluted by a non-reactive gas such as Ar, N$_2$, He, Ne, Xe, or mixtures thereof. The flow rate of this dilution gas is in the range of about 100 to 1000 sccm. To form a monolayer on the surface of the substrate, the copper precursor pulse time is in the range of about 0.01 to 10 seconds and is preferably in the range of about 0.05 to 2 seconds. At the end of the precursor pulse, the copper precursor vapor flow into the deposition zone 101 is terminated.

The deposition zone 101 is then purged for an appropriate time to remove excess copper precursor. During this purge step, the non-reactive gas from source 103 may be conveyed into the deposition zone 101. Suitable non-reactive gases include but are not limited to Ar, He, Ne, Xe, N$_2$ or mixtures thereof. The purge gas flow is preferably the same as the total gas flow through the delivery line 108 during the copper precursor pulse step. The purge step can be carried out for a time in the range of about 0.1 to 10 seconds and is preferably from about 0.5 to 5 seconds.

A reactant gas is then introduced from a reactant gas source 105 into the deposition zone 101 by activating appropriate valves (not shown) coupled to the delivery line 108. The reactive gas 105 can be ozone, oxygen, water, or mixtures thereof. The reactive gas reacts with the copper precursor monolayer to form a layer of copper oxide on the substrate surface. The total reactive gas flow rate is in the range of about 100 to 2000 sccm and is preferably in the range of about 200 to 1000 sccm. If ozone is used as the reactive gas, the ozone concentration is in the range of about 150 to 300 g/m$^3$ and is preferably about 200 g/m$^3$. After the reactive gas pulse, a purge gas from source 103 is again introduced to remove excess reactive gas.

To reduce the copper oxide layer formed during the deposition step to form the copper layer, a hydrogen-containing gas, with or without dilution, is then introduced from source 106 into the deposition zone 101. The hydrogen containing gas 106 contact the copper oxide layer and reduces the copper oxide to form a copper layer.

Finally, the hydrogen-containing gas is purged from the deposition zone 101 with an inert gas 103 for an appropriate period of time. This whole sequence of steps is then repeated as many times as desired to form a copper layer of a desired thickness.

Of advantage, the copper films formed by the present method exhibit high purity, good step coverage over deep trenches, and strong adhesion to the substrate and are particularly suitable as seed layers for copper interconnect applications. Subsequent steps such as electrochemical plating, CVD or PVD followed by CMP may be employed to complete damacene formation.

While the present invention is disclosed by reference to the preferred embodiments and examples detailed above, it is to be understood that these examples are intended in an illustrative rather than limiting sense, as it is contemplated that modifications and combinations will readily occur to those skilled in the art, which modifications and combinations will be within the scope of the invention and the scope of the appended claims.

What is claimed:

1. A method of forming a copper layer on a substrate, comprising:

forming a copper oxide layer by atomic layer deposition comprising alternatively reacting a surface of the substrate with a non-fluorine containing copper precursor and an oxygen containing gas; and reducing the copper oxide layer by contacting the copper oxide layer with a hydrogen containing gas to form a copper layer on the substrate.

2. The method of claim 1 wherein the steps of forming a copper oxide layer and reducing the copper oxide layer are carried out at substantially the same temperature.

3. The method of claim 2 wherein the steps of forming a copper oxide layer and reducing the copper oxide layer are carried out at a temperature in the range of about 100 to 300° C.

4. The method of claim 1 wherein the step of forming a copper oxide layer is carried out at a temperature below about 200° C.

5. The method of claim 1 wherein the non-fluorine containing copper precursor is a copper alkoxide, copper-diketonate or copper dialkylamide.

6. The method of claim 5 wherein said copper alkoxide comprises $[Cu(t-BuO)]_4$, said copper-diketonate comprises $Cu(tetramethylheptadionate)_2$, and said copper dialkylamide has the formula of $[Cu(NR2)]_4$ where R represents alkyl.

7. The method of claim 1 wherein said oxygen containing gas is ozone, oxygen, water or any mixture thereof.

8. The method of claim 1 wherein the step of reducing the copper oxide layer comprises reducing the copper oxide layer by contacting with a hydrogen containing gas at a temperature below about 200° C.

9. A method of forming a copper film on a substrate by atomic layer deposition, comprising:

introducing a non-fluorine containing copper precursor gas about a substrate provided in a chamber;

removing excess copper precursor gas from the chamber;

introducing an oxygen containing gas into the chamber to form a layer of copper oxide on the substrate;

removing excess ozone from the chamber; and introducing a hydrogen containing gas into the chamber to reduce the copper oxide layer to form a copper layer; wherein the steps of forming the copper oxide layer and reducing the copper oxide layer are carried out at a temperature of below about 200° C.

10. The method of claim 9 wherein the steps of forming the copper oxide layer and reducing the copper oxide layer are carried out at a pressure in the range of about 100 mTorr to 10 Torr.

11. The method of claim 9 wherein the non-fluorine containing copper precursor is a copper alkoxide, copper-diketonate or copper dialkylamide.

12. The method of claim 11 wherein the non-fluorine containing copper precursor is selected from the group consisting of $[Cu(t-BuO)]_4$, $Cu(tetramethylheptadionate)_2$ and copper dialkylamide.

13. The method of claim 9 wherein the oxygen containing gas is ozone, oxygen, water, or any mixture thereof.

14. The method of claim 13 wherein the oxygen containing gas is ozone.

15. The method of claim 9 wherein the copper precursor is introduced at a flow rate in the range of about 1 to 1000 sccm.

16. The method of claim 9 wherein the copper precursor is introduced in pulse at a pulse time of about 0.01 to 10 seconds.

17. The method of claim 9 wherein the oxygen containing gas is introduced at a flow rate in the range of about 100 to 2000 sccm.

* * * * *